United States Patent
Boek et al.

(10) Patent No.: US 6,328,807 B1
(45) Date of Patent: Dec. 11, 2001

(54) CHUCK HEATER FOR IMPROVED PLANAR DEPOSITION PROCESS

(75) Inventors: Heather D. Boek, Corning; Elizabeth A. Boylan, Big Flats; Haibo Huang, Painted Post; Pascale Laborde, Corning; Gary L. Lewis, Campbell; William P. Ryszytiwskyj; Pushkar Tandon, both of Corning, all of NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 09/461,082

(22) Filed: Dec. 14, 1999

(51) Int. Cl.$^7$ ............................. C23C 16/00; C23C 16/02
(52) U.S. Cl. ......................... 118/724; 118/725; 118/728; 65/355; 65/356
(58) Field of Search .......................... 118/725, 728, 118/724; 65/386, 416, 355, 356; 427/223, 248.1, 450, 452, 255.19

(56) References Cited

U.S. PATENT DOCUMENTS

| | | | |
|---|---|---|---|
| 4,363,647 | * 12/1982 | Bachman et al. | 65/18.2 |
| 4,772,302 | * 9/1988 | Abe | 65/3.12 |
| 5,581,874 | * 12/1996 | Aoki et al. | 29/825 |
| 5,595,241 | * 1/1997 | Jelinek | 165/80.1 |
| 5,622,750 | 4/1997 | Killian et al. | 427/163.2 |
| 5,695,568 | * 12/1997 | Sinha et al. | 118/729 |
| 6,192,712 | * 2/2001 | Saito et al. | 65/386 |
| 6,207,305 | * 3/2001 | Nishioka et al. | 428/698 |
| 6,207,932 | * 3/2001 | Yoo | 219/444.1 |
| 6,239,402 | * 5/2001 | Araki et al. | 219/121.4 |
| 6,258,459 | * 7/2001 | Noguchi et al. | 428/446 |

FOREIGN PATENT DOCUMENTS 58-74532 * 5/1983 (JP) .

* cited by examiner

Primary Examiner—Jeffrie R. Lund
(74) Attorney, Agent, or Firm—Price, Heneveld, Cooper, DeWitt & Litton

(57) ABSTRACT

A method and apparatus for the flame hydrolysis deposition (FHD) of a core material on a substrate provides a holder for a substrate which is heated to a predetermined temperature selected to maintain the substrate temperature relatively constant during the FHD process. As a result, the thickness of a thin film applied to the substrate is relatively uniform as is the index of refraction of the core material deposited on the substrate. In one embodiment, a chuck for receiving a disk-shaped substrate wafer is supplied with an embedded electrical heater for maintaining the chuck temperature at from about 700° C. to about 900° C. In another embodiment, a gas heater positioned on a side of the chuck opposite the wafer mounting is provided to heat the chuck at substantially the same temperature. In either embodiment, a chuck is rotated with respect to a line-flame burner which introduces a vaporized mixture of organometallic material into the line-flame burner for depositing a thin film of from about 5 to 6.5 microns of doped glass on the wafer substrate.

5 Claims, 5 Drawing Sheets

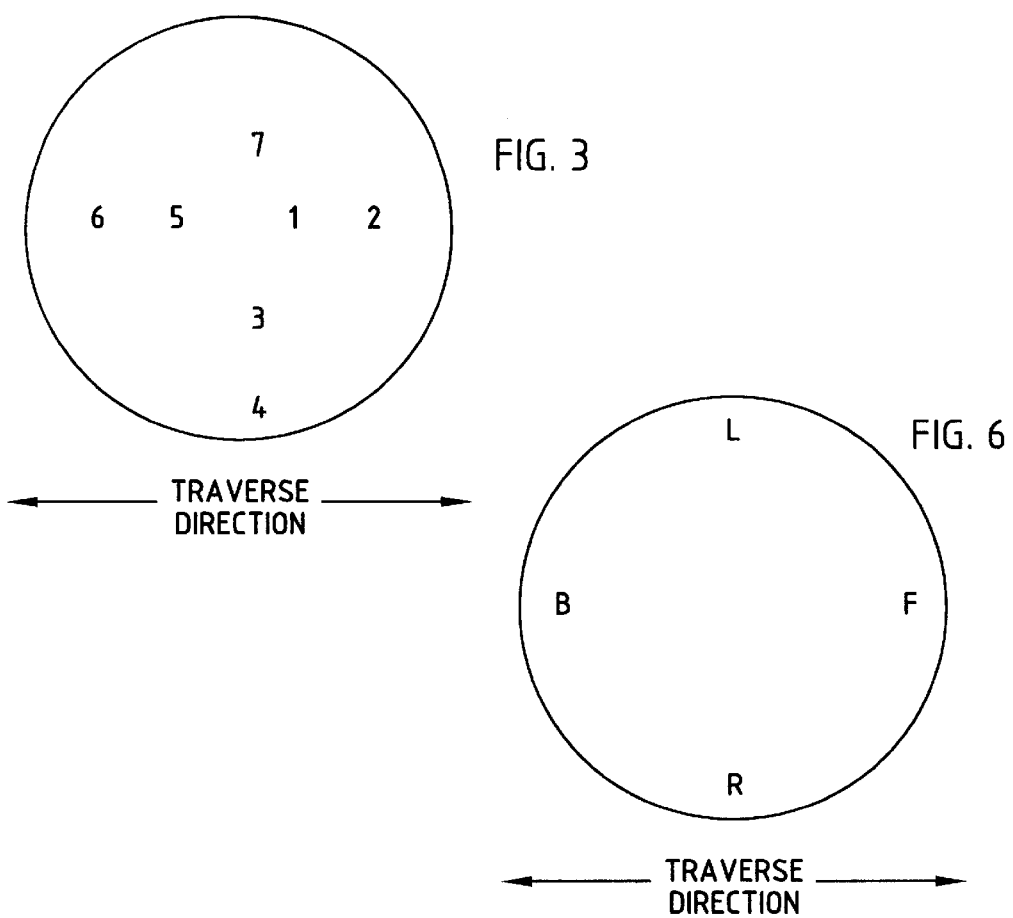
FIG. 3
FIG. 6
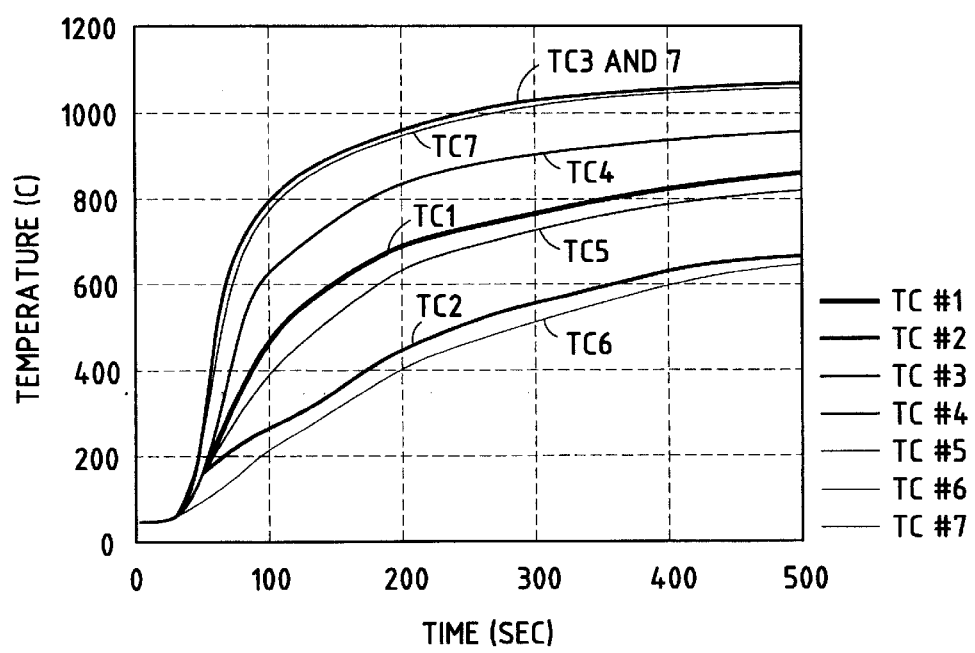
FIG. 4

$V_f = V_r = 1$ CM/SEC

| POSITION | MEAN TEMPERATURE (C) | STANDARD DEVIATION (C) |
|---|---|---|
| F | 605 | 5 |
| B | 560 | 4 |
| R | 585 | 2 |
| L | 515 | 2 |

$V_f = 0.5$ CM/SEC   $V_r = 5$ CM/SEC

| POSITION | MEAN TEMPERATURE (C) | STANDARD DEVIATION (C) |
|---|---|---|
| F | 595 | 10 |
| B | 555 | 9 |
| R | 575 | 4 |
| L | 515 | 2.5 |

$V_f = V_r = 5$ CM/SEC

| POSITION | MEAN TEMPERATURE (C) | STANDARD DEVIATION (C) |
|---|---|---|
| F | 575 | 1 |
| B | 545 | 1 |
| R | 565 | 1 |
| L | 505 | 1 |

| TRAVERSE LENGTH (cm) | METHANE FLOW RATE (splm) | STANDOFF (mm) | CHUCK TEMPERATURE (C) |
|---|---|---|---|
| 34 | 10 | 15 | 574 |
| 25.5 | 8.5 | 22.5 | 587 |
| 17 | 10 | 30 | 673 |
| 34 | 7 | 30 | 492 |
| 34 | 7 | 15 | 503 |
| 34 | 10 | 30 | 564 |
| 17 | 10 | 15 | 683 |
| 17 | 7 | 15 | 620 |
| 17 | 7 | 30 | 604 |

US 6,328,807 B1

CHUCK HEATER FOR IMPROVED PLANAR DEPOSITION PROCESS

BACKGROUND OF THE INVENTION

1. Field of the Invention

The present invention relates to a deposition process for planar lightwave devices and particularly to an improved apparatus and method for depositing thin films onto a substrate.

2. Technical Background

A key step in the manufacturing of planar optical components is the deposition of thin films onto a substrate. Planar optical components require that the deposited doped thin glass films have uniform properties when used as planar waveguides for optical components used, for example, in the telecommunication industry.

The soot/glass deposition rate by the flame hydrolysis deposition (FHD) process is thermophoretically dominated and, it was discovered, is adversely influenced by variations in the substrate temperature. Typically, a silica, si, sapphire or other wafer substrate is held in a vacuum chuck which is rotated and a line-flame burner translated with respect to the chuck to provide a uniform coating of doped glass material onto the substrate. It was discovered, however, that the uniformity of the thickness of a film coating utilizing such a process varied over the surface of the resultant wafer-shaped coated substrate as did the index of refraction despite the rotation as well as the translation in X-Y directions of the substrate relative to the flame during the FHD process. This discovery of a pattern of thickness variations and index of refraction variations lead to experimental testing of the temperature of a chuck exposed to a line-flame translated across the chuck and the resultant discovery that significant temperature variations occur during the exposure of the chuck, and a wafer substrate attached to the chuck, to a line-flame burner. As a result of the discovery of the pattern of thickness variations and index of refraction variations and the resultant correlation of such variations with variations in the temperature of the chuck, the source of the problem of film thickness and index of refraction variations was discovered.

SUMMARY OF THE INVENTION

The method and apparatus of the present invention overcomes the thickness non-uniformities of the flame hydrolysis deposition (FHD) process by providing a holder for a substrate which is heated to a predetermined temperature selected to maintain the substrate temperature relatively constant during the FHD process. As a result, the thickness of a thin film applied to the substrate is relatively uniform as is the index of refraction of the resultant core material deposited on the substrate. In one embodiment of the present invention, a chuck receives a disk-shaped wafer substrate and includes an electrical heater for maintaining the chuck temperature at from about 700° C. to about 900° C. In another embodiment, a gas heater is positioned on a side of the chuck opposite the substrate wafer to heat the chuck to substantially the same temperature range. In either embodiment, a chuck is rotated with respect to a line-flame burner which introduces a vaporized mixture of organometallic material into the line-flame burner for depositing a thin film of from about 5 to 6.5 microns of doped glass onto the wafer substrate.

The method of the present invention includes heating a wafer-holding chuck to a predetermined temperature while holding a substrate wafer in the chuck and flame hydrolysis depositing soot/glass onto the substrate. Although the present invention is described in the environment of a flame hydrolysis deposition, other deposition techniques may also benefit from the system of the present invention.

Additional features and advantages of the invention will be set forth in the detailed description which follows and will be apparent to those skilled in the art from the description or recognized by practicing the invention as described in the description which follows together with the claims and appended drawings.

It is to be understood that the foregoing description is exemplary of the invention only and is intended to provide an overview for the understanding of the nature and character of the invention as it is defined by the claims. The accompanying drawings are included to provide a further understanding of the invention and are incorporated and constitute part of this specification. The drawings illustrate various features and embodiments of the invention which, together with their description serve to explain the principals and operation of the invention.

BRIEF DESCRIPTION OF THE DRAWINGS

FIG. 3 is a plan schematic view showing the placement of test thermocouples in a wafer used to test temperature variations on the surface of the chuck holding the wafer, as seen in FIG. 2;

FIG. 4 is a diagram of the temperature variations on the surface of the chuck during preheating;

FIG. 6 is a plan schematic view of the placement of test thermocouples positioned on the back side of a metal chuck.

DETAILED DESCRIPTION OF THE PREFERRED EMBODIMENT

Figure 1:
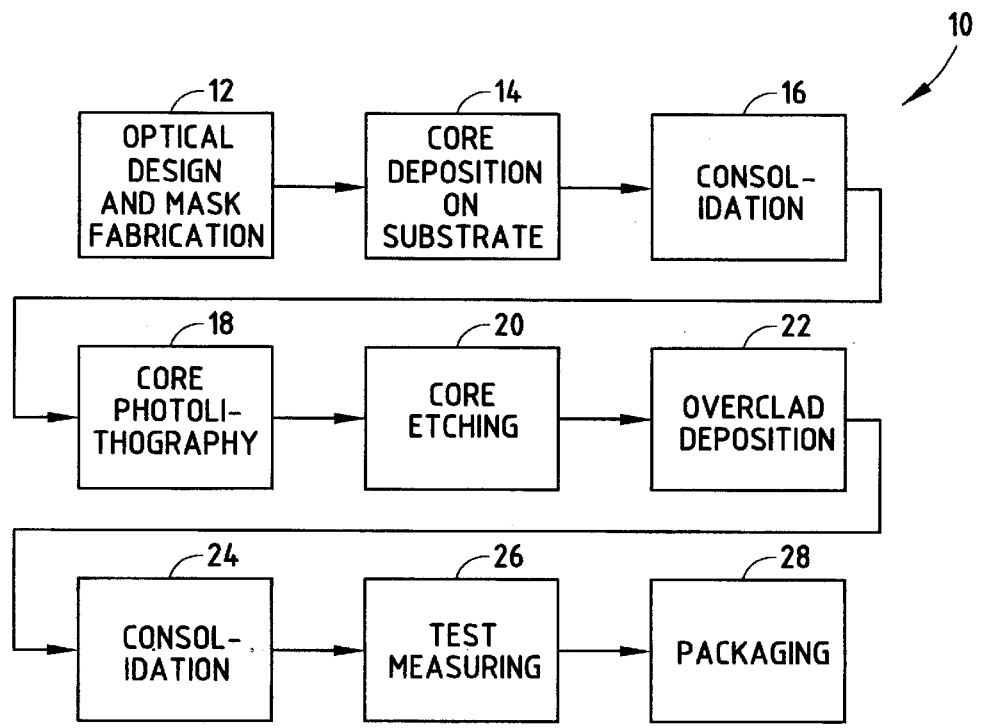
FIG. 1 is a flow chart illustrating the manufacturing process for planar lightwave devices.

FIG. 1 illustrates a typical commercial manufacturing process for a planar lightwave circuit, such as an array of optical switches, interferometers, fiber Bragg gratings, couplers, and the like. The process 10 initially includes the optical design of the device and mask fabrication for the photolithography process employed to form the optical circuit in the core material, as shown by block 12. The design typically is accomplished utilizing conventional, computer-aided design techniques. In an exemplary process, a 4" diameter substrate wafer is then placed in a chuck in a deposition process system shown in FIG. 2, as indicated by block 14, for the deposition of a glass material having a higher index of refraction than the substrate and forming the core for the optical circuit. Once a thin film of core material has been deposited onto the substrate, the combination is placed in a consolidation oven to anneal the wafer and core, as indicated by step 16. Subsequently, a photo-sensitive resist material is placed over the thin film and exposed to radiation according to the mask configuration for providing a pattern of optical waveguides in the core, as shown by block 18. Next, the exposed resist is etched, as indicated by step 20, to form the waveguides and spaces there between. An overclad layer is then deposited on the etched core, utilizing a process similar to the core deposition but utilizing a material having a lower refractive index to sandwich the core between the substrate and overcladding, as shown by step 22. The combination is then again consolidated in an oven, as indicated by block 24, after which the resultant optical device is tested, as indicated by block 26, to assure that it meets performance standards. Finally, the optical device is packaged in a hermetically sealed package with optical fiber pigtails for input and output signals in a conventional manner, as indicated by block 28.

Figure 2:
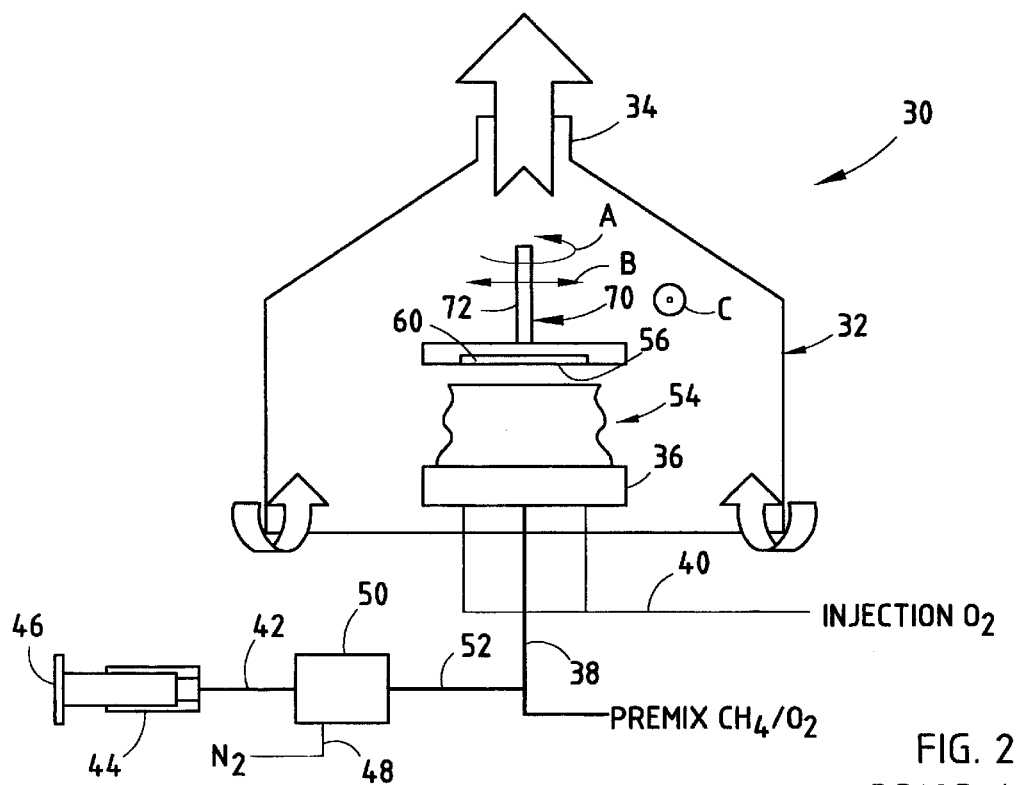
FIG. 2 is a schematic view of apparatus employed for the flame hydrolysis deposition of a thin film onto a wafer substrate.

The equipment used in connection with the deposition step 14 is shown in FIG. 2, which schematically illustrates the system 30 for depositing a core material on a wafer substrate. The process illustrated is a flame hydrolysis deposition process, which takes place under a suitable hood 32 with an exhaust outlet 34. A line or slot burner 36 receives a fuel mixture of methane ($CH_4$) and an oxidant ($O_2$) in a gas conduit 38 with injection oxygen being supplied to burner 36 through conduit 40. A liquid premixed organometallic precursor including a dopant, such as Boron or the like, is injected into a conduit 42 from a reservoir 44 using a metered pump or other conventional equipment illustrated at 46. A carrier gas, such as nitrogen, is supplied to a heated vaporizing line 50 through conduit 48. The nitrogen carrier gas and vaporized organometallic mixture is supplied to the burner conduit 38 through conduit 52 with the burner 36 forming a line of soot 54, which is applied to the exposed surface 56 of wafer substrate 60 held in a vacuum chuck 70. Chuck 70 has a hollow spindle 72 coupled to a lathe (not shown) for rotating the chuck in the direction indicated by arrow A in FIG. 2 during the deposition process. The chuck and burner are translated with respect to each other in x and y directions, as indicated by arrows B and C, typically by the movement of the burner over the surface of the chuck which rotates about spindle 72. A vacuum source (not shown) is coupled to spindle 70 for holding the wafer substrate 60 to chuck 70.

The chuck diameter is from 7" to 12", typically made of quartz, although metal chucks made of a nickel alloy such as INCONEL® may also be used to hold the silica wafer substrate. The flame temperature of burner 36 typically is greater than 1000° C. with the wafer surface temperature ranging from 700° to 900° C. for sintering the soot 54 and forming a doped glass layer onto the surface of the wafer. The deposition of from about 5 to 6.5 $\mu$m layer of doped glass forming the core of the planar lightwave circuit requires multiple passes of the burner and chuck depending upon the speed of the traverse of the burner with respect to the wafer substrate, the spacing, and the flame temperature. The process typically takes about two hours to complete.

It has been shown that depositing presintered core glass films result in improved performance of planar optical devices. Presintering of core layer leads to very uniform composition on a microscopic scale, which in turn results in a layer with lower propagation loss. For a given set of conditions, whether the deposited layer is presintered or not is dictated by the relative rates of soot deposition and soot sintering on the substrate. Controlling the substrate temperature is one way of obtaining presintered core glass layers The substrate temperature needed to have presintered glass can be estimated by comparing the characteristic times of sintering and deposition. Since the characteristic time of sintering is estimated to be:

$$t_s = \frac{\mu(T, \omega_i) d_p}{\sigma(T, \omega_i)}$$

where $\mu$ and $\sigma$ are the deposited soot viscosity and surface energy and $d_p$ is the soot particle diameter. The viscosity of the deposited material is a very sensitive function of substrate temperature, T, and deposit composition, $\omega_i$, and for core layers can be estimated. characteristic time od deposition, $t_d$, is calculated as:

$$t_d = \frac{t_p \rho_p (\pi d_p^3 / 6)}{W} \left( \frac{D}{2 d_p} \right)^2$$

where $t_p$ is the time per pass of the chuck over the flame, $\rho_p$ is the density of soot particles, W is the soot deposited per pass and D is the substrate wafer diameter. A presintered deposit would be expected for process conditions for which $t_d > t_s$ (i.e., sintering rate is faster than the deposition rate), while sooty deposits would be expected for $t_s > t_d$ (deposition rate is faster than the sintering rate). For example, the standard overclad process deposition time is estimated to be about 10 seconds. A substrate temperature of 830° C. is needed to obtain presintered glass.

It was discovered that dopant concentration non-uniformities at different locations on the substrate are in part due to substrate temperature variations and fluctuations as the chuck traverses over the burner. Seven thermocouples were suspended through the holes drilled in the chuck, as seen in FIG. 3, such that the thermocouple tips just appear on the fire-side of the chuck. Temperatures were measured as the chuck traversed over the burner. Measured temperatures for the case of no traverse and with a traverse speed of 1.09 cm/sec both at 17 mm standoff are shown in FIGS. 4 and 5, respectively.

Figures 5, 7:
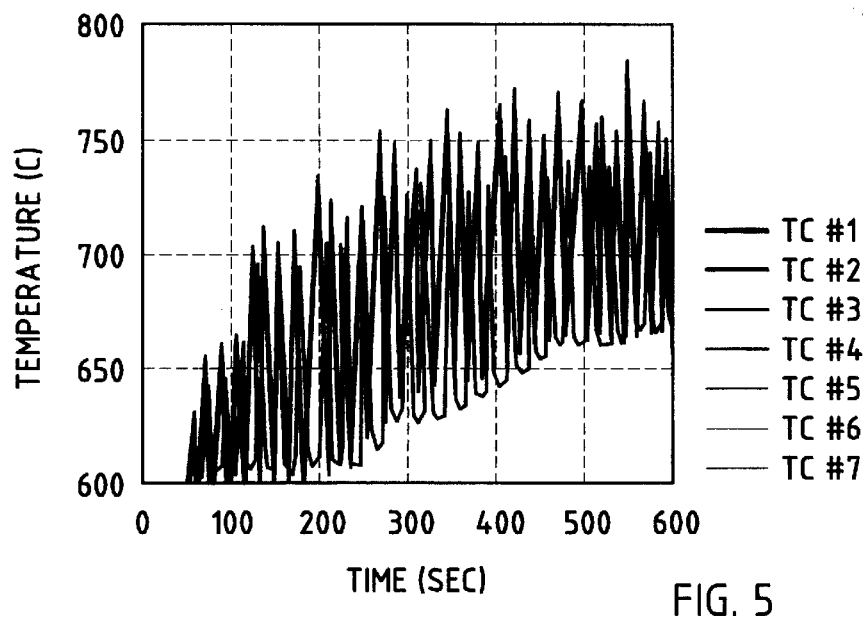
FIG. 5 is a diagram showing the temperature variations occurring on the surface of the chuck with a flame traverse rate of 1.09 cm per second.
FIG. 7 is a table showing the temperature variations of the thermocouples shown in FIG. 6 for different translation rates between the chuck and line-flame burner.

As can be seen by viewing FIGS. 4 and 5, the temperature of the chuck varies dramatically with, for example in FIG. 4, the preheating of the chuck resulting in end temperature variations of nearly 400° C. between positions 6 and 7 and variations between even adjacent thermocouples of nearly 200° C. As seen in FIG. 5, as the line-flame and chuck traverse (translation only shown, no rotation), as the flame passes under the chuck, the temperature spikes dramatically and subsequently subsides. A rotation of the chuck does not eliminate the spiking of temperatures but merely changes its pattern. These tests were conducted on a quartz chuck. Additional tests were conducted on a metal chuck with four thermocouples positioned on the back surface of the chuck at locations L, F, R and B, as shown in the diagram of FIG. 6.

Temperature fluctuations on the back side of a metal chuck were also measured as it traversed over the flame for different traverse rates. The mean temperature and standard deviation for different traverse rates are shown in the tables of FIG. 7 and are seen to be very sensitive to the transverse speed. Similar measurements also revealed mean temperature and fluctuations to be sensitive to traverse distance, methane flow rate (for constant methane to oxygen flow rate ratio), and burner standoff. The chuck temperature sensitivity to traverse distance, methane flow rate, and burner standoff tested relationship is shown in the table of FIG. 8, illustrating the dramatic difference in chuck temperature at a given location for the various parameters illustrated.

Figures 8, 9:
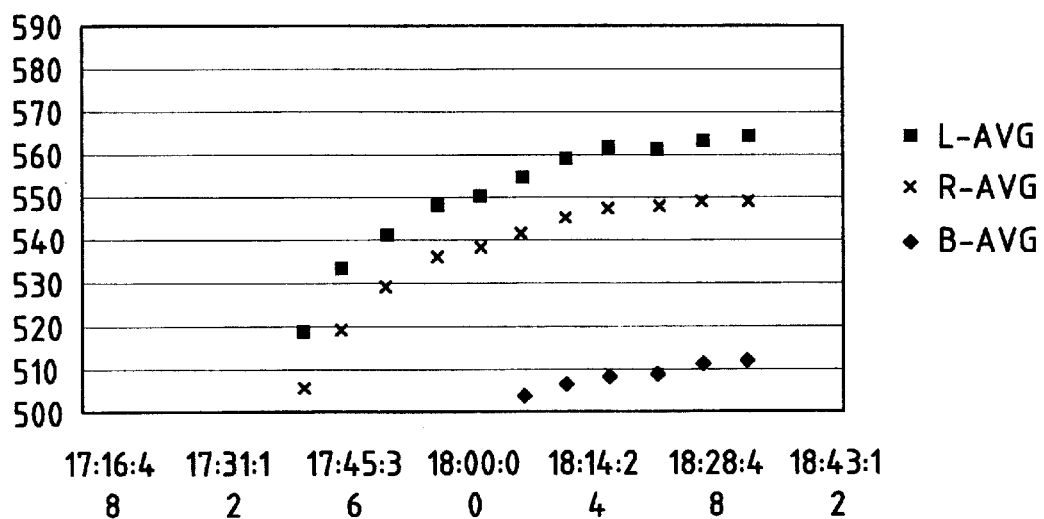
FIG. 8 is a table showing the chuck temperature variations with traverse distance, methane flow rate, and burner stand-off for a chuck employed in a flame hydrolysis deposition process.
FIG. 9 is a graph showing the asymmetry between the front and right test thermocouples for centered chuck traverse at a rate of 5 cm per second.

FIG. 8 shows that the chuck temperature can vary from a low of 492° C. for a relatively wide traverse length of 34 cm, a methane flow rate of 7 slpm and a standoff of 30 mm to as high as 683° C. for a traverse length of 17 cm (the flame remaining closer to the measurement point), a higher methane flow rate of 10 slpm and a standoff of only 15 mm. The asymmetry between the locations on the chuck are illustrated in the graph of FIG. 9, showing the mean of temperatures measured at the four locations illustrated in FIG. 6 for a traverse rate of 5 cm/sec with the traverse distance being 9" and a transverse (Y direction) distance of 4 cm.

It is believed that the asymmetrical temperature variations are due to the exposure of a flame to the undersurface of the wafer as it passes from the edge of the wafer to the center, thereby exposing the front and back sections for the direction of traverse shown in FIG. 6 at the front sector of the wafer, as seen in FIG. 6, at the beginning and at the end of the cycle of traverse while the left and right areas at the middle of the wafer are gradually exposed with peak exposure occurring at the one-quarter and three-quarter times of the completed traverse cycle. Thus, depending upon the position on the surface of the wafer, not only do temperature variations exist, they are asymmetric. This discovery of the problem, which results in variations in index of refraction and thickness of the film deposited on the substrate, lead to its solution as shown in one embodiment in FIGS. 10–12.

Figure 10:
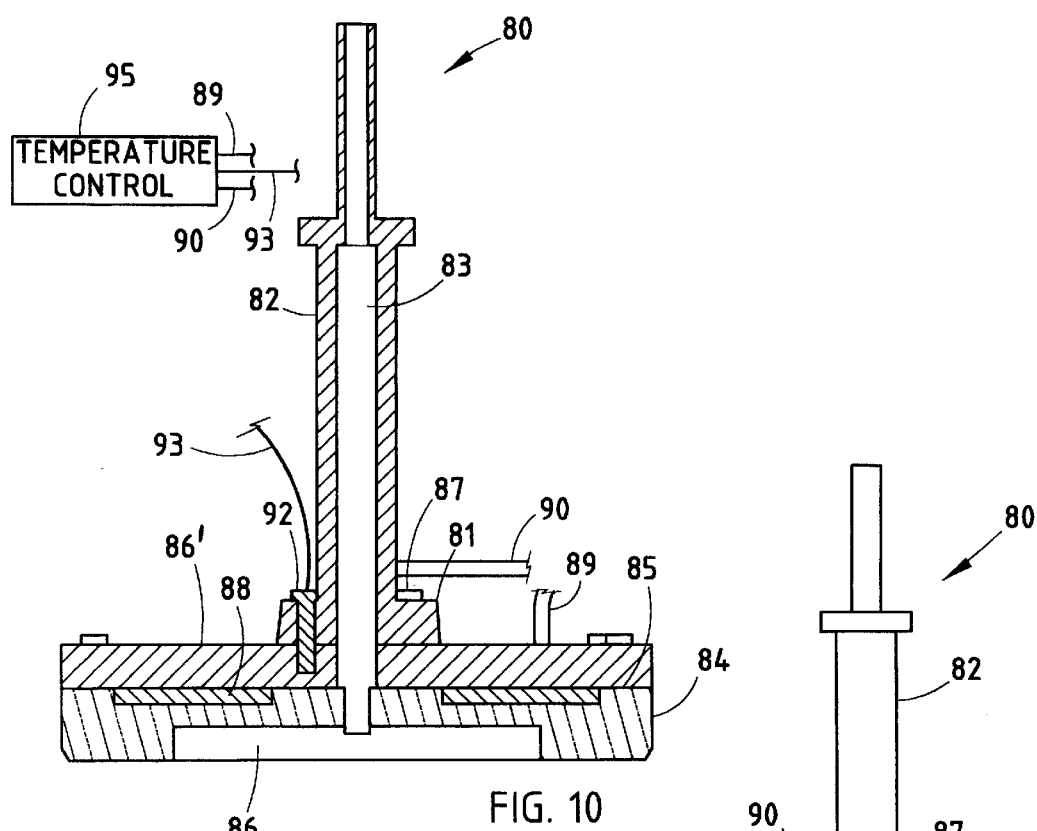
FIG. 10 is a vertical cross-sectional view of an improved chuck design incorporating the present invention.
Figure 11:
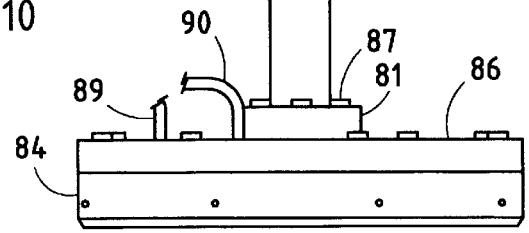
FIG. 11 is a front elevational view of the chuck shown in FIG. 10.
Figure 12:
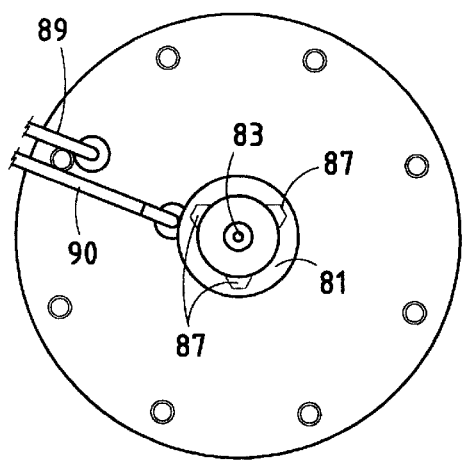
FIG. 12 is a top plan view of the chuck shown in FIG. 11.

The chuck assembly 80 shown in FIGS. 10–12 replaces the conventional chuck assembly 70 in the system shown in FIG. 2 and includes a hollow drive spindle 82 to which can be attached to a vacuum source for holding a wafer substrate within a disk-shaped recess 86 on the lower surface of the chuck. The chuck includes a quartz face disk 84 with a recess 86 for receiving a wafer 56 of substrate material, which recess communicates with the central axially extending opening 83 of the chuck for holding the wafer in position. The spindle 82 is attached to a conventional lathe for rotating the chuck during the deposition process of a speed of from about 0.1 to about 60 rpm during the deposition process which takes approximately two hours. The quartz face disk 84 is secured to a metal backing plate 86' to which spindle 82 is attached by a flange 81 and bolts 87.

The top surface 85 of face plate 84 includes an annular recess 85' for receiving an annular resistance heater 88, which includes conductors 89 and 90 extending therefrom and to a conventional temperature-controlling power source 95 (shown in block form in FIG. 10 only) for heating the chuck to a temperature of from about 700° C. to about 900° C. A conventional slip ring connection of conductors 89 and 90 to a regulated temperature controlling-power source 95 permits rotation of the chuck with respect to the electrical conductors extending therefrom. A temperature sensor 92 is embedded in the rear surface of the chuck and in thermal communication with the face plate 84 to provide signal information to the temperature-controlling power source 95 for maintaining the chuck at the desired temperature of from about 700° C. to about 900° C. Signals from the temperature sensor 92, which can be a thermocouple, likewise is coupled through a slip ring connection by conductors 93 to the temperature-controlling power supply 95. By maintaining the chuck temperature elevated to above the lower temperature variations of the surface of the chuck, the resultant uniformity of thickness of the deposition as well as the index of refraction is dramatically improved.

Heater 88 can be a pancake-type disk heater embedded in the quartz face plate 84 of the chuck and activated prior to the flame deposition process to preheat the chuck to stabilize the temperature before the flame deposition process takes place. In place of the electrical heating system shown, a gas chuck heating system can be employed, as schematically illustrated in FIG. 13.

Figure 13:
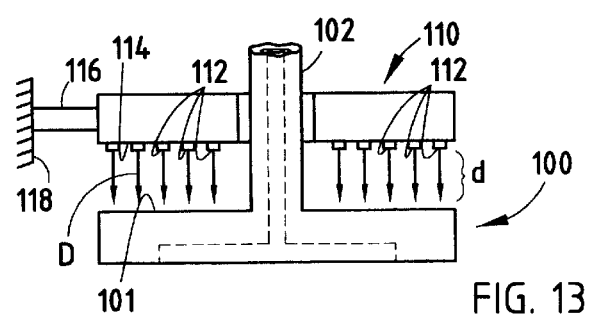
FIG. 13 is a vertical, schematic view of an alternative embodiment of the chuck embodying the present invention.

In FIG. 13, a chuck 100 is illustrated having the same construction as a conventional quartz or metal chuck but with an annular gas heater 110 suspended around the hollow spindle 102 of chuck 100 a distance "d" of approximately ½" to 1" above the chuck such that the flames indicated by arrows "D" in FIG. 13 extend downwardly onto the upper surface 101 of chuck 100 for preheating the chuck. The burner 110 includes a plurality of gas jets 112 on its lower surface 114 spaced to provide a desired heating pattern to the chuck 100 for minimizing temperature variations on the chuck during the deposition of thin film on a wafer substrate held by the chuck during the FHD process. Burner 110 is fixedly supported with respect to the chuck by a mounting arm 116 attached to a stationary support 118 within the hood 32 of the structure shown in FIG. 2. A conventional supply of gas can be employed for providing a clean flame to the upper surface of the chuck without interfering with the flame hydrolysis deposition process. A temperature sensor and gas control valve can be employed with burner 110 to maintain the temperature of the surface of the substrate holder or chuck 100 and the substrate wafer at from about 700° C. to about 900° C.

Thus, with either embodiment shown in FIGS. 10–12 or 13, structure for and the resulting method of depositing a thin film material onto a wafer by stabilizing the temperature of the substrate holder, such as a chuck, and, therefore, the substrate results in a uniform thin film core material being deposited onto the substrate. This results in a uniform index of refraction for the core of the subsequently manufactured planar lightwave device. Although the embodiments disclose a substrate holder in the form of a rotatable metal or quartz chuck, other substrate holders may beneficially employ the method and apparatus of this invention.

It will become apparent to those skilled in the art that various modifications to the preferred embodiment of the invention as described herein can be made without departing from the spirit or scope of the invention as defined by the appended claims.

The invention claimed is:

1. A holder assembly for a substrate used in a flame hydrolysis deposition process comprising:

a holder having a surface for receiving a substrate material; and a heater mounted to said holder on a side opposite the surface for elevating the temperature of said surface to from about 700° C. to about 900° C.;

wherein said heater comprises a gas heater.

2. A chuck assembly for use in connection with a flame hydrolysis deposition process comprises:

a chuck having a surface for receiving a substrate material; and a heater mounted in association with said chuck on a side opposite the surface for elevating the chuck temperature to from about 700° C. to about 900° C.;

wherein said heater comprises a gas heater.

3. The assembly as defined in claim 2 wherein said gas heater comprises an annular heater positioned above an upper surface of said chuck.

4. A holder assembly for use in connection with a deposition process for a planar optical component comprises:

a holder having a surface for receiving a substrate; and a heater mounted to said holder on a side opposite the surface for heating the surface of the holder to a temperature to from about 700° C. to about 900° C.;

wherein said heater comprises a gas heater.

5. The assembly as defined in claim 4 wherein said holder is a rotatable chuck and said gas heater comprises an annular heater positioned above an upper surface of said chuck.

* * * * *